United States Patent
Ko et al.

(10) Patent No.: US 6,571,393 B1
(45) Date of Patent: May 27, 2003

(54) DATA TRANSMISSION SYSTEM

(75) Inventors: Tsz-Mei Ko, Kln (HK); Ming Liou, Kln (HK); Kwan-Fai Cheung, NP (HK); Roger Cheng, Kln (HK); Bo Hu, Kowloon (HK); Donghui Qu, Kln (HK)

(73) Assignee: The Hong Kong University of Science and Technology, Kowloon (HK)

(*) Notice: Subject to any disclaimer, the term of this patent is extended or adjusted under 35 U.S.C. 154(b) by 0 days.

(21) Appl. No.: 09/084,501

(22) Filed: May 27, 1998

(51) Int. Cl.⁷ .................. H03G 11/04; H04N 7/173; H04N 17/00; H04B 17/00
(52) U.S. Cl. .................. 725/121; 725/127; 725/149; 348/192; 333/18; 455/63; 455/69; 455/67.4; 455/67.6
(58) Field of Search .................. 725/91, 98, 127, 725/107, 114, 118, 119, 148, 149, 78; 375/224, 227, 231, 285; 455/43, 67.3, 67.4, 67.6, 63, 68, 69; 333/17.1, 18; 708/322; 348/192, 193, 723, 724

(56) References Cited

U.S. PATENT DOCUMENTS

| | | | | |
|---|---|---|---|---|
| 3,849,744 A | * | 11/1974 | Furuya | 333/28 R |
| 4,103,243 A | * | 7/1978 | Orban | 327/309 |
| 4,658,296 A | * | 4/1987 | Beech | 348/489 |
| 4,910,791 A | * | 3/1990 | Dickinson et al. | 379/22.02 |
| 4,982,440 A | * | 1/1991 | Dufresne et al. | 725/125 |
| 5,008,903 A | * | 4/1991 | Betts et al. | 375/221 |
| 5,247,347 A | | 9/1993 | Litteral et al. | |
| 5,249,200 A | * | 9/1993 | Chen et al. | 329/349 |
| 5,313,298 A | * | 5/1994 | Meeker | 348/613 |
| 5,353,280 A | * | 10/1994 | Ungerbock | 370/252 |
| 5,410,343 A | | 4/1995 | Coddington et al. | |
| 5,461,640 A | | 10/1995 | Gatherer | |
| 5,463,661 A | * | 10/1995 | Moran et al. | 370/286 |
| 5,515,398 A | * | 5/1996 | Walsh et al. | 370/252 |
| 5,533,049 A | * | 7/1996 | Lin | 348/613 |
| 5,535,246 A | * | 7/1996 | Beech | 348/613 |
| 5,541,757 A | | 7/1996 | Fuse et al. | |
| 5,579,336 A | * | 11/1996 | Fitzgerald et al. | 333/28 R |
| 5,592,482 A | | 1/1997 | Abraham | |
| 5,594,491 A | | 1/1997 | Hodge et al. | |
| 5,600,712 A | * | 2/1997 | Hanson et al. | 375/231 |
| 5,621,455 A | | 4/1997 | Rogers et al. | |
| 5,625,863 A | | 4/1997 | Abraham | |
| 5,649,053 A | * | 7/1997 | Kim | 704/229 |
| 5,659,581 A | * | 8/1997 | Betts et al. | 370/286 |
| 5,790,523 A | * | 8/1998 | Ritchie et al. | 370/241 |
| 5,806,022 A | * | 9/1998 | Rahim et al. | 379/406.03 |
| 5,870,429 A | * | 2/1999 | Moran et al. | 370/252 |
| 5,963,262 A | * | 10/1999 | Ke et al. | 348/446 |
| 5,983,070 A | * | 11/1999 | Georges et al. | 455/14 |
| 6,038,222 A | * | 3/2000 | Osler et al. | 370/282 |
| 6,058,406 A | * | 5/2000 | Karanovic | 708/313 |
| 6,091,766 A | * | 7/2000 | Yoshida | 375/222 |
| 6,263,016 B1 | * | 7/2001 | Bellenger et al. | 370/231 |

OTHER PUBLICATIONS

Microsoft Computer Dictionary, Microsoft Press, Fourth Edition, p. 170.*

* cited by examiner

Primary Examiner—Andrew Faile
Assistant Examiner—Jason Salce
(74) Attorney, Agent, or Firm—Burns, Doane, Swecker & Mathis, L.L.P.

(57) ABSTRACT

A data transmission system is proposed, for example for video-on-demand, internet or multimedia applications, in which a number of subscribers in a building are connected to a central server through at least in part twisted pair cables within the building. Compensation for the channel distortion caused by the use of twisted pair cables is provided by the use of pre-emphasis filters in the outgoing data lines from the server. The required coefficients for the pre-emphasis filters are established by first characterizing the distortion properties of a channel by the use of a test signal.

18 Claims, 6 Drawing Sheets

9 TAP FRACTIONAL SPACED (T/2) PREEMPHASIS FILTER

FIG. 8(b)

9 TAP CONVENTIONAL PREEMPHASIS FILTER

FIG. 8(c)

5 TAP FRACTIONAL SPACED (T/2) PREEMPHASIS FILTER

FIG. 8(d)

3 TAP FRACTIONAL SPACED (T/2) PREEMPHASIS FILTER

DATA TRANSMISSION SYSTEM

FIELD OF THE INVENTION

This invention relates to a method for the distribution of data, e.g. video signals, and in particular to the distribution of video signals into a residential or commercial building, for example as part of a video-on-demand system.

BACKGROUND OF THE INVENTION

With the trend towards deregulation in the industry and with the development of new technologies, television programs and video are obtainable through increasing number of means. No longer is a viewer restricted to the choice of programming provided by conventional terrestrial broadcasters, supplemented by the purchase of rental of prerecorded video tapes, laser discs, video CDs and others. Television and video programming are now available by satellite and also cable systems. In addition, the content of such systems has broadened beyond conventional programming to include multi-media elements, Internet connections, interactive television and so on.

One difficulty with such alternative channels is distribution of television programs and the like. With a conventional cable system, appropriate cabling is provided directly to a consumer's premises. However, with the advent of digital technology in telecommunications, it is becoming increasingly popular for television and video programming to be provided by telecommunications companies through existing telephone networks.

Generally in densely populated urban cities it is common for telecommunication services to be provided through a network of optical fibre cables that extend as far as the basement of a residential or commercial building, and then for signals to be carried to individual users within a building by a twisted-pair cable. However, while a twisted-pair cable is more than adequate for carrying voice transmissions and simple data transmission (e.g. fax or Internet transmissions), such a cable introduce channel distortion that degrades picture quality.

PRIOR ART

There are a large number of existing patents in this general field of technology and of which the following are a representative sample. U.S. Pat. No. 5,541,757 describes a typical video-on-demand (VOD) system that uses fibre cables for video distribution. Using fibre cables the system can achieve high-quality results, but the fibre cables are expensive themselves and must be installed in the premises concerned which increases both the cost and inconvenience of the installation of the system. U.S. Pat. No. 5,592,482 and U.S. Pat. No. 5,625,863 describe methods for distributing analog video signal using in-wall electrical wiring. The systems of these patents, however, are limited to the transmission of analog signals, and furthermore the use of conventional electrical wiring in this context can be unsafe.

U.S. Pat. No. 5,410,343, U.S. Pat. No. 5,247,347, U.S. Pat. No. 5,621,455 and U.S. Pat. No. 5,594,491 describe VOD systems for distributing MPEG-1 format videos (MPEG being an acronym for the Motion Picture Experts Group) over public switched telephone networks using Asymmetric Digital Subscriber Line (ADSL) technology. ADSL is a transmission technology for providing high data rate service from a central office to subscribers. The ADSL Forum has adopted multitone for the ADSL-2 standard based on the result of simulations and measurements from existing loop plants up to 18 kft. However, it is not normally necessary to transport data beyond a few kilo-feet in a densely populated city, and in addition private VOD systems, intranets and multimedia information systems for hotels, large corporations, hospitals and so on generally only require high bandwidth transmission for only a few hundred feet. Thus while providing high-quality service, such proposed ADSL systems are unnecessarily expensive.

Figure 1:
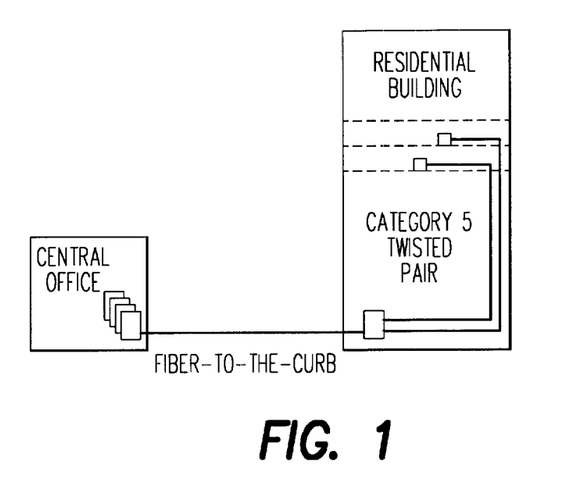
FIG. 1 shows schematically a fiber-to-curb data transmission system.

An increasingly common possibility, especially for VOD and the like services provided by telecommunications companies, is a so-called "fibre-to-the-curb" system as shown in FIG. 1 in which fibre cables are laid to the basement of a residential or commercial building, and then conventional twisted pairs are used for in-building distribution. A disadvantage with this technique, however, is the problem of channel distortion in the relatively low-quality twisted-pairs. One conventional way of overcoming such problems is to provide channel equalization at the receiver, for example using a technique of the type outlined in U.S. Pat. No. 5,461,640. One disadvantage with using equalisation at the receiver, however, is that an equalizer must be provided for every subscriber.

SUMMARY OF THE INVENTION

It is an object of the invention to overcome the problem of channel distortion in a cost-effective manner to allow the use of twisted pairs for carrying high-rate data transmissions in a building.

According to the present invention there is provided a data transmission system comprising, a server array, a plurality of subscribers, a plurality of data lines from said server, connection means for connecting said subscribers to said server, said subscribers being connected to said connection means by respective cables, and pre-emphasis filter means provided in each said data line from said server.

The present invention is applicable in any situation where the cables has relatively linear distortion properties. In some cases, for example data distribution at high rates such as 100 Mbps, even coaxial cables may suffer such distortion. However the present invention is particularly applicable to systems using twisted-pair cables which suffer such distortion at lower rates (e.g. less than 10 Mbps) at which MPEG-2 videos are transmitted.

In order to establish the correct properties of the pre-emphasis filter required to compensate for the distortion, the data transmission system further comprises means for characterizing the distortion properties of each channel from said server to a said subscriber, and means for calculating and establishing the required properties of said pre-emphasis filter means to compensate for said distortion properties.

Preferably the characterization means comprises means for transmitting a test signal to a receiver at a said subscriber, means for returning said test signal from said receiver to said transmitting means, and means for calculating the distortion properties of a said channel from the delay in returning said signal from said receiver to said transmitting means.

In a particularly preferred embodiment the transmitting means is adapted to generate an increasing test signal preceded by a header, and said receiving means is adapted to generate a first return signal when said header is received and a second return signal when said test signal reaches a predetermined threshold at said receiving means, and said transmitting means includes clock means for determining the time interval between the test signal being transmitted by said transmitting means and the return signals being received at said transmitting means from said receiving means.

The test signal is preferably a linearly increasing signal which may be quantized or non-quantized.

Preferably the pre-emphasis filter is a tap-line filter, preferably either a conventional tap-line filter or a fractional tap-line filter. The best results are obtained with a fractional tap-line filter which can obtain good compensation for the channel distortion with as little as a third order filter. However, other forms of pre-emphasis filter may also be used, such as finite impulse response filters whose coefficients can be obtained easily by using an inverse fast Fourier transform.

Viewed from another aspect the present invention provides apparatus for the characterization of the amplitude and phase response of a data channel between a transmitter and a receiver, wherein said transmitter comprises means for transmitting a test signal to said receiver, means for detecting the arrival of a return signal from said receiver and means for timing the delay between transmitting said test signal and detecting said return signal, wherein said receiver comprises means for generating a return signal when a received transmitted signal exceeds a predetermined threshold, and means for calculating the amplitude and phase response of said data line from said delay.

In a preferred embodiment the transmitting means is adapted to generate an increasing test signal preceded by a header, and said receiving means is adapted to generate a first return signal when said header is received and a second return signal when said test signal reaches a predetermined threshold at said receiving means, and said transmitting means includes clock means for determining the time interval between aid test signal being transmitted by said transmitting means and said return signals being received at said transmitting means from said receiving means.

Again the test signal is preferably a quantized or non-quantized linearly increasing signal.

Viewed from a still further aspect the present invention provides a method for transmitting data from a server to a plurality of subscribers along a data channel comprising a cable having relatively linear distortion properties, comprising characterizing the distortion properties of said data channel prior to transmitting said data along said data channel, and passing said data through a pre-emphasis filter prior to transmission along said data channel to compensate for said distortion.

Viewed from a still further aspect the present invention provides a method for the characterization of the amplitude and phase response of a data channel between a transmitter and a receiver, comprising transmitting a test signal to said receiver, generating a return signal from said receiver to said transmitter when a received transmitted signal exceeds a predetermined threshold, detecting the arrival at said transmitter of a said return signal from said receiver and timing the delay between transmitting said test signal and detecting said return signal, and calculating the amplitude and phase response from said delay.

BRIEF DESCRIPTION OF THE DRAWINGS

Some embodiments of the present invention will now be described by way of example and with reference to the accompanying drawings, in which.

DETAILED DESCRIPTION OF PREFERRED EMBODIMENTS

As described above, FIG. 1 shows a typical fiber-to-the curb in which data is transmitted from a central office to a residential building using fibre cables. Within the building the data is transmitted to a plurality of different users by means of conventional category 5 twisted pair cables.

Figure 2:
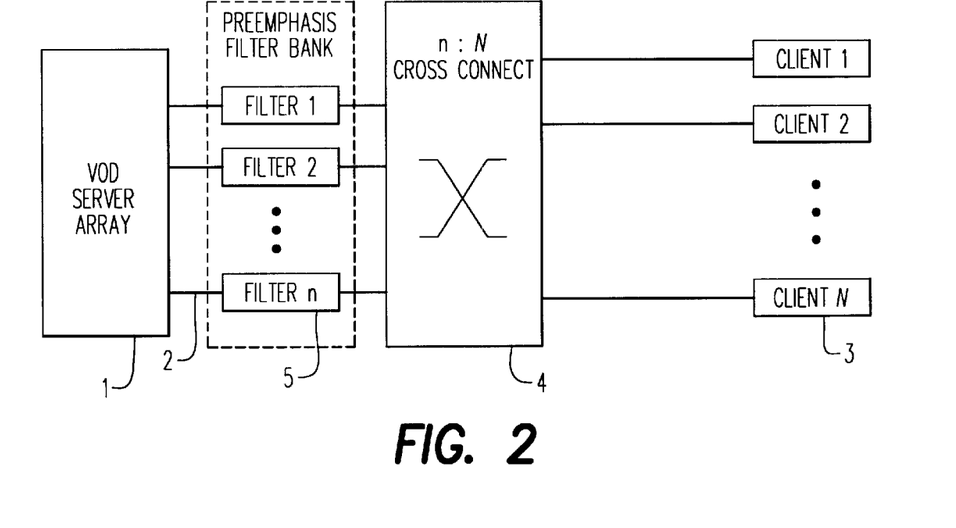
FIG. 2 shows schematically a system according to an embodiment of the present invention.

In order to overcome the channel distortion that will be experienced by the use of the twisted pairs, either equalization at the receiver or pre-amplification at the transmitter can be used (or a combination of both). However, for a system having N subscribers but only supporting n subscribers simultaneously (where n<N) it is more cost effective to use pre-emphasis filters at the transmitter since only n filters will be required, one for each of the n outgoing data lines, whereas if the equalization technique is followed N equalizers must be provided, one for each receiver. This is illustrated in FIG. 2 which shows a central VOD server array 1 which may be located at the central office and which has n outgoing data lines 2. Outgoing data lines 2 from the server are connected to the receivers 3 of N subscribers in the residential building through a cross-connection means 4. As can easily be seen in FIG. 2, using pre-emphasis filters 5 to provide pre-amplification at the receiver requires the use of only n such filters—one for each of the n data lines 2—whereas N equalizers must be provided if the equalization approach is followed. A further advantage of using a pre-emphasis filter system is that a pre-emphasis system will have a low bit-error-rate than an equalizer system in an additive white Gaussian noise channel since an equalizer would also amplify the noise in trying to compensate the distorted signal.

Figure 3:
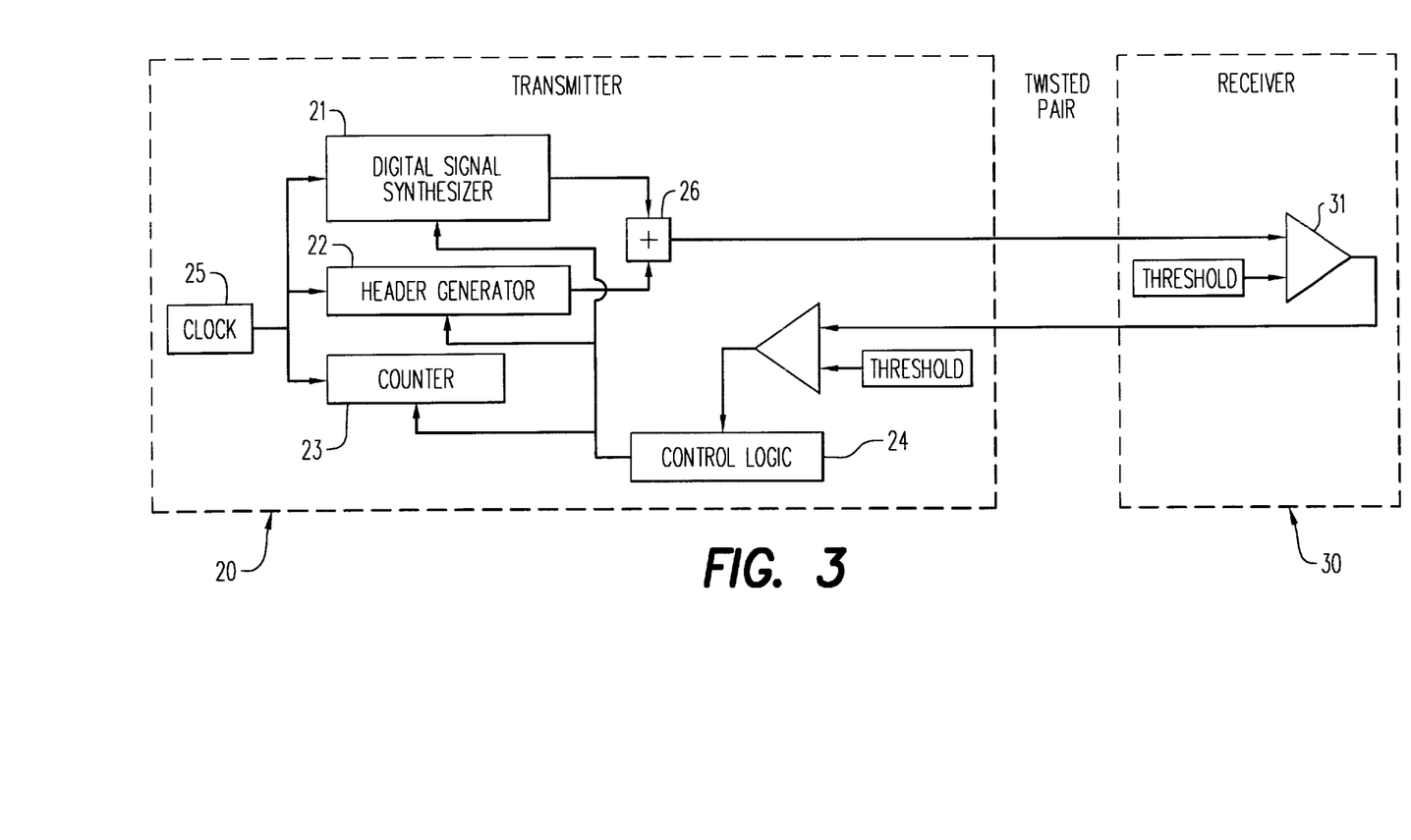
FIG. 3 shows a channel characterization system.

The use of pre-emphasis filters, however, requires that the frequency response of each channel must firstly be identified. Once the channel is characterized, the appropriate pre-emphasis filter for compensation can be determined as:

$$f_p(\omega_n) = f^{-1}(\omega_n) = \frac{1}{A(\omega_n)} e^{-j\phi(\omega_n)} \quad n = 0, 1, 2, \ldots$$

Where $A(\omega_n)$ and $\phi(\omega_n)$ are the magnitude and phase responses of the twisted pair at frequency $\omega_n$ respectively. The coefficients for this pre-emphasis filter can be found numerically by IFFT (inverse fast Fourier transform) techniques. FIG. 3 illustrates a system for the channel characterization of the pre-emphasis filter system. As can be seen from FIG. 3 the characterization system comprises a transmitter 20 and a receiver 30. The transmitter comprises a digital signal synthesiser 21, header generator 22 and counter 23 all being under the control of control logic 24 and all receiving a timer input from clock 25. Adding means 26 is also provided to put together a header generated by header generator 22 with a test signal generated by signal synthesiser 21.

In order to determine the characterization of the channel, the transmitter generates a test signal with a header which is transmitted along the channel in question to the receiver 30. Receiver 30 comprises a comparator 31 which compares the input test signal with a threshold value and sends a return signal to the transmitter when a signal higher than the threshold value is detected. It should be noted that the comparator is the only additional component required by the receiver to perform this characterization of the channel, and so the present invention does not require an expensive receiver.

In use, the transmitter sends a gradually increasing test signal in the form $$x(t) = kt \sin(\omega_n t), n = 0, 1, 2, 3 \ldots$$

Figure 4A:
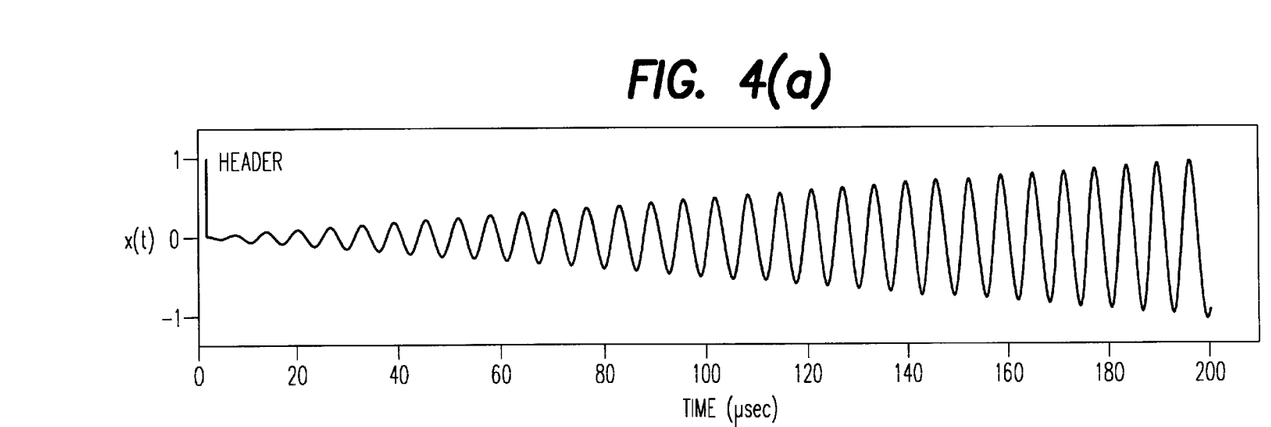
FIGS. 4(a) and 4(b) show the shape of (a) non-quantized and (b) quantized channel characterization test signals.

The test signal also includes a header and is shown in FIG. 4. When the test signal is sent the counter is caused to begin counting. The receiver 30 detects the arrival of the header by virtue of the header being greater than the threshold value and sends a return signal to the transmitter 20. When the transmitter 20 detects this return signal it will record the counter value to determine the round trip delay time $t_1$ from transmitter to receiver and back again.

When the receiver 30 detects that the test signal is above the threshold level $A_{th}$ another return signal is sent to the transmitter 20 and the transmitter detects this second return signal and stops the counter and reads the time $t_2$. Thus, $t_{th} = t_2 - t_1$ is the time that it takes for the test signal to reach the threshold level at the receiver 30.

Figure 5:
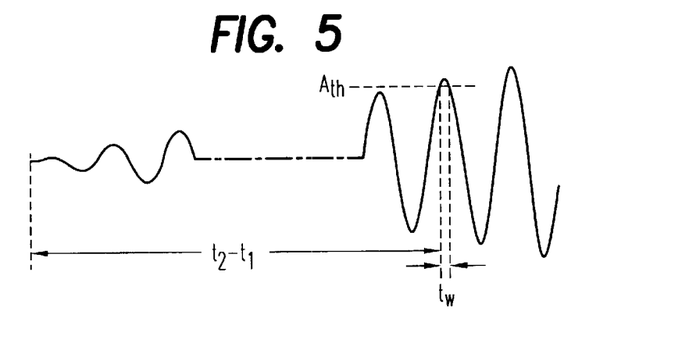
FIG. 5 shows a test signal magnified for clarity, FIGS. 6(a) & (b) show the results of the channel characterization for (a) magnitude response, and (b) phase response, FIG. 7 schematically illustrates a tap-line filter.

With the above system the received signal will first reach the fixed threshold at the receiver 30 when the corresponding test signal is $x(t_{th}) = kt_{th} \sin(\omega_n t_{th}) = kt_{th}$ 9 since the tip of the gradually increasing sine wave signal should pass the threshold first (see FIG. 5). Thus $kt_{th} A(\omega_n) = A_{th}$ and the magnitude response of the channel can be determined as $$A(\omega_n) = \frac{A_{th}}{kt_{th}} = \frac{A_{th}}{k(t_2 - t_1)}. \qquad \text{(eqn. 1)}$$

The phase response of the channel being characterized can be determined from the measured delay as $$\phi(\omega_n) = -\omega_n t_d = -\frac{\omega_n t_1}{2} \qquad \text{(eqn. 2)}$$

where $t_d$ is the one-way delay from transmitter to receiver and $t_1$ is the round trip delay from transmitter to receiver and back to the transmitter. However, the experimental results obtained from Eq.2 are not sufficiently accurate—especially at high frequencies—due to measurement errors for $t_1$ (which is of the order of micro-seconds). Thus preferably the phase response is characterized using $t_2$ (which can be measured accurately) and $t_1$. Again it should be noted that the received test signal should pass the threshold $A_{th}$ near to the tip of a sine cycle (FIG. 5), ie the phase of the received signal $\phi_r(\omega_n)$ is approximately $\pi/2$. The phase for the corresponding transmitted signal is $$\phi_t(\omega_n) = \omega_n \left(t_2 - \frac{t_1}{2}\right).$$

Thus the phase response can be approximated by $$\phi(\omega_n) = \phi_r(\omega_n) - \phi_t(\omega_n) = \frac{\pi}{2} - \omega_n \left(t_2 - \frac{t_1}{2}\right).$$

The minor inaccuracy in this equation can further be reduced by measuring the width $t_w$ of the reply signal (FIG. 5) to correct $\phi_r(\omega_n)$ as $$\phi_r(\omega_n) = \frac{\pi}{2} - \omega_n \frac{t_w}{2}.$$

and consequently $$\phi(\omega_n) = \frac{\pi}{2} - \omega_n \left(t_2 - \frac{t_1}{2} + \frac{t_w}{2}\right) \qquad \text{(eqn. 3)}$$

Figure 4B:
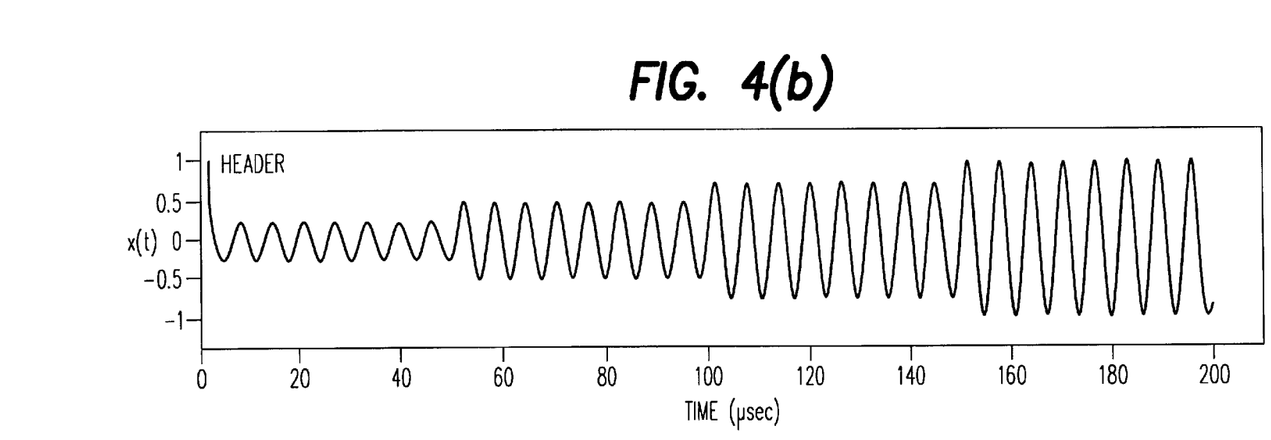
Figure 6A:
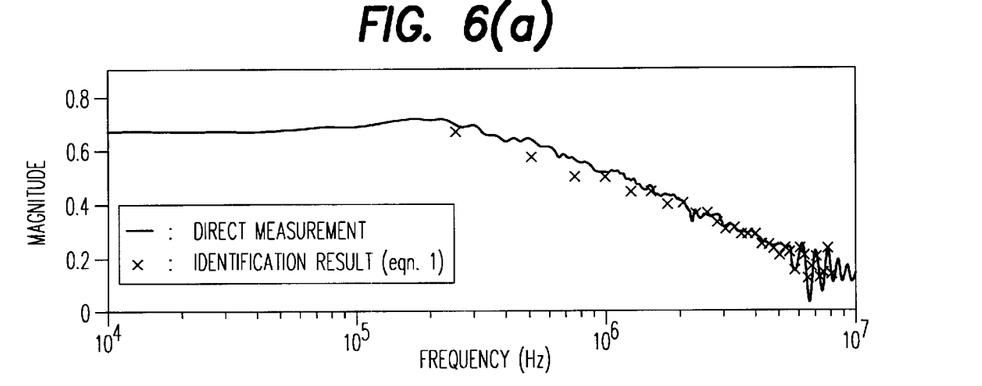
Figure 6B:
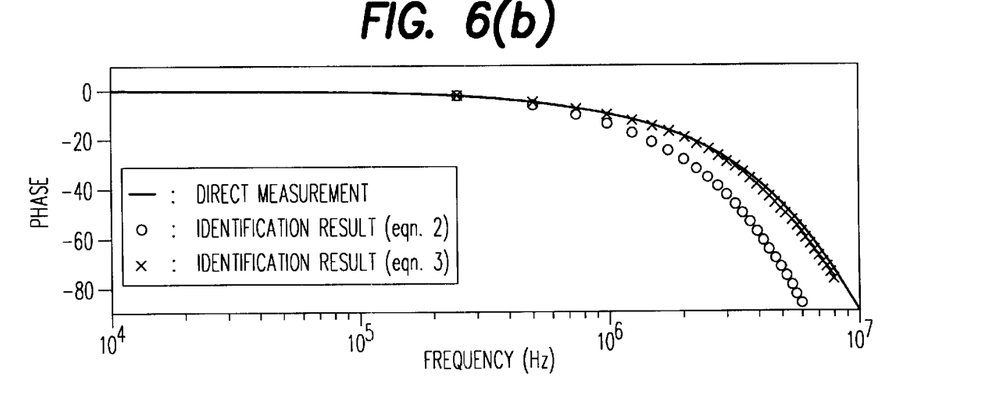

In practice, the linearly increasing test signal would be quantized to a finite number of amplitude levels. A sample quantized test signal (with four quantization amplitude levels) is shown in FIG. 4(b). Quantization provides two benefits. The test signal at a particular quantized amplitude level generates a 100% pure tone, whereas in comparison a non-quantized test signal contains other frequencies near to the desired tone which can produce small errors in the frequency response identification. The use of a quantized test signal allows these errors to be eliminated. In addition, the transmitter hardware can be simplified if it is only required to generate a quantized test signal. FIGS. 6(a) & (b) show for comparison the results for (a) magnitude and (b) phase response identification using a 32-level quantized test signal with the above equations and compared with results measured by a vector signal analyzer. The phase response using Eq.3 closely matches the measured results. The magnitude response identification accuracy can be improved still further by increasing the number of quantization levels.

In a VOD system it is only necessary to characterize the channel once during call set-up since a twisted pair cable can be assumed to be substantially time-invariant (at least over a period of one or two hours—a typical time frame for watching programming from a VOD server). Thus in a practical embodiment of the invention, the abovedescribed channel characterization is performed every time a user first establishes a link to the server to view a VOD transmission. This helps to keep the overheads to a minimum. If however the twisted pair is under extreme conditions or there is a very noisy environment, more frequent characterization can be performed.

Once the channel characterization has been completed and the magnitude $A(\omega_n)$ and phase $\phi(\omega_n)$ responses for a given channel have been identified, the channel distortion can be compensated for by a pre-emphasis filter with magnitude response $A_p(\omega_n) = 1/A(\omega_n)$ and phase response $\phi_p(\omega_n) = \phi(\omega_n)$ (for $n = 0, 1, 2, \ldots$). A suitable structure for the pre-emphasis filter is a FIR (finite impulse response) design since a twisted pair channel has a relatively linear phase response and an FIR filter with symmetric coefficients has an ideal linear phase delay.

Figure 7:
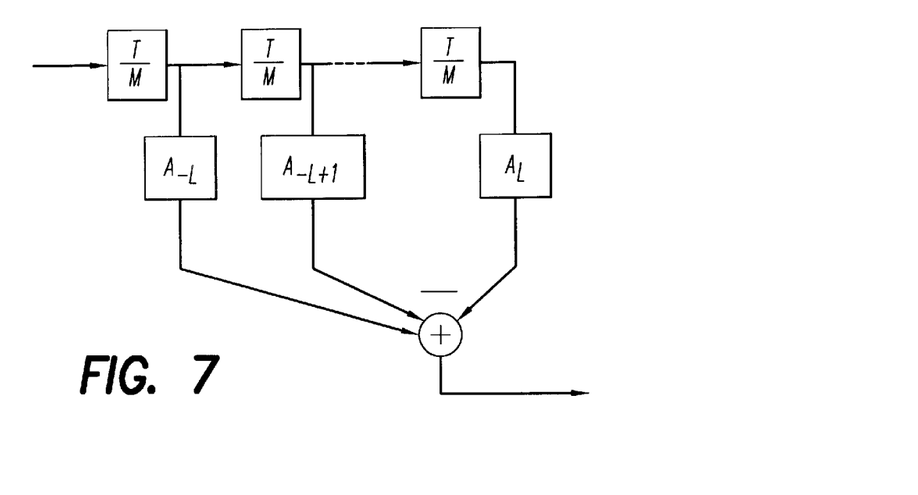
Figure 8A:
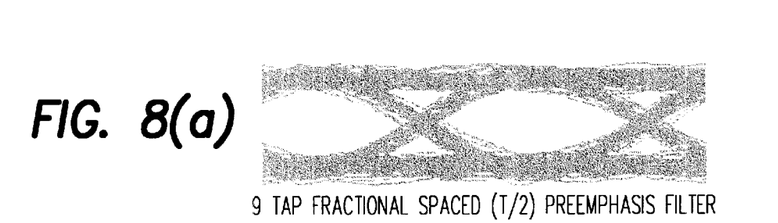
FIGS. 8(a)–(d) show eye diagrams for four pre-emphasis filter systems in accordance with embodiments of the invention.
Figure 8B:
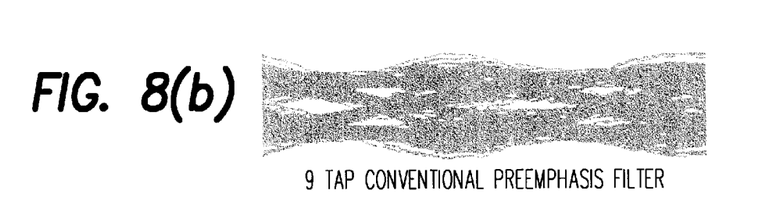
Figure 8C:
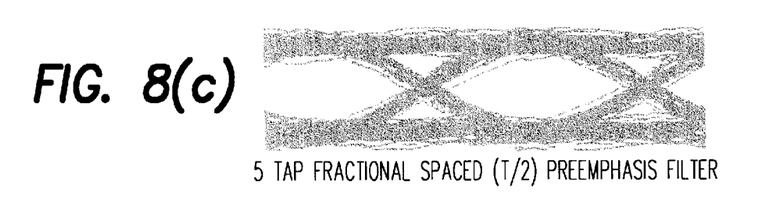
Figure 8D:
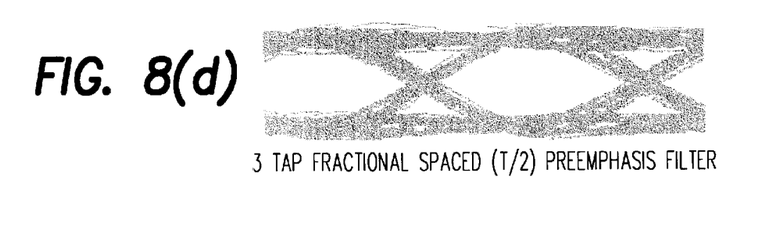

FIG. 7 shows the general structure for a tap-line pre-emphasis filter that may be used in accordance with an embodiment of the present invention. In this pre-emphasis filter, $A_i (-L \leq i \leq L)$ are the coefficients and T is one symbol period. For M=1 it is called a conventional tap-line filter, whereas where M>1 it is called a fractional spaced tap-line filter.

For a conventional tap-line pre-emphasis filter, the coefficients can be obtained directly by taking the IFFT of the frequency response from 0 to 1/T Hz. If N denotes the number of frequency points used in the channel characterization process and H[n] denotes the sampled frequency response for the pre-emphasis filter, ie $$H[n] = A_p(\omega_n)e^{\phi_p(\omega_n)} = \frac{1}{A(\omega_n)}e^{-\phi(\omega_n)} \text{ for } n = 1, 2, \ldots, N.$$

Then the sampled impulse response would be $$h[k] = \frac{1}{N}\sum_{n=0}^{N-1} H[n]\overline{W}_N^{nk} \text{ for } k = 1, 2, \ldots, N \quad \text{(eqn. 4)}$$

Where $$W_N = e^{-j\frac{2\pi}{N}}.$$

If h[m] is the coefficient with the largest magnitude, ie h[m]=max|h[k]|, since a short distance twisted pair has a relatively small distortion most of the coefficients h[k] are much smaller (in magnitude) than h[m]. Thus Eq.4 can be approximated by an Lth order tap-line pre-emphasis filter with $A_i = h[m+i]$ for $-L \leq i \leq L$ For a fractional spaced pre-emphasis filter the impulse response obtained by Eq.4 may be re-sampled and then similarly truncated to 2L+1 coefficients. Another possible method that can be employed is to identify the channel response up to M/T Hz so that the delay between adjacent coefficients h[i] and h[i+1] is T/M seconds. This method is more accurate but requires a greater overhead for the channel characterization process, and as will be shown below the first method produces satisfactory results.

FIG. 8 shows the eye diagrams at the receiver for transmitting data at 8.33 Mbps (a typical rate for high quality MPEG-2 video transmissions) through a 1000 feet category 5 twisted pair using conventional and fractional spaced T/2 tap-line pre-emphasis filters. For the fractional spaced pre-emphasis filter the re-sampling method is used to obtain the filter coefficients. Simulation results show that fractional spaced T/2 pre-emphasis filters have better performance than conventional tap-line pre-emphasis filters with the same number of taps and hence the same hardware complexity. Although fractional spaced tap-line pre-emphasis filters require a higher clock frequency, high-speed D/A converters are readily available and relatively inexpensive. The availability of inexpensive D/A converters also supports the use of pre-emphasis filers instead of equalizers which require expensive high-speed A/D converters. In FIG. 8, (a) shows a 9 tap fractional spaced (T/2) pre-emphasis filter, (b) a 9 tap conventional pre-emphasis filter, (c) a 5 tap fractional spaced (T/2) pre-emphasis filter, and (d) a 3 tap fractional spaced (T/2) pre-emphasis filter. These eye-diagrams show that a 3 tap fractional spaced (T/2) pre-emphasis filter is sufficient to compensate for channel distortion in a twisted pair.

Figure 9:
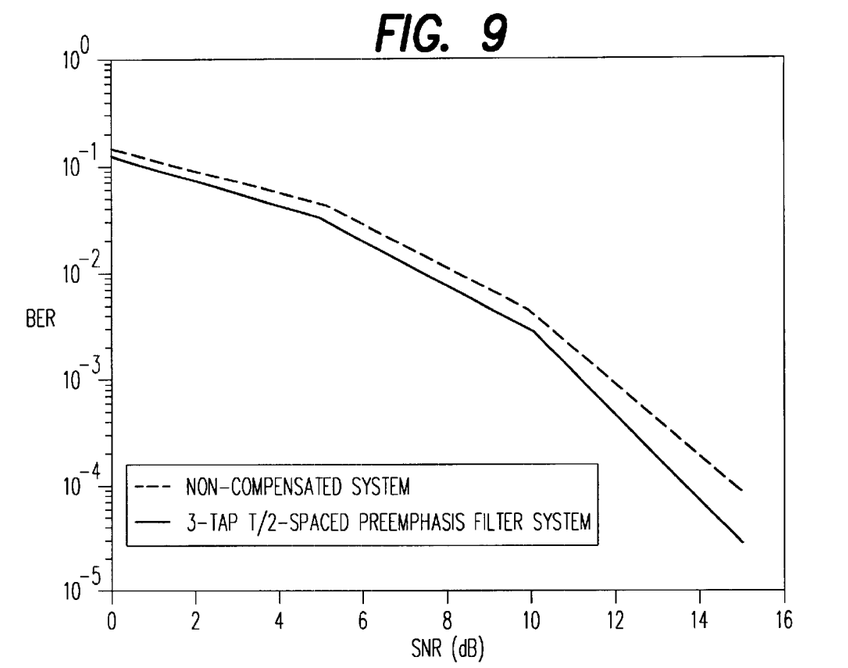
FIG. 9 shows the performance of a pre-emphasis filter system in accordance with the invention and a non-compensated system with no synchronization error.
Figure 10:
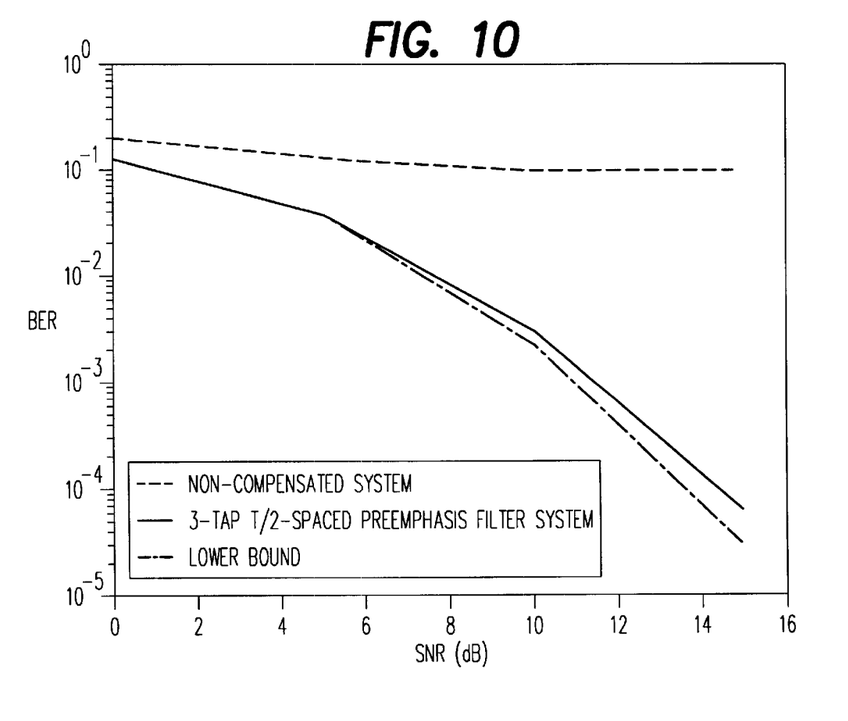
FIG. 10 shows the performance of two pre-emphasis filter systems in accordance with the invention and a non-compensated system with a 25% synchronization error.

The advantages of the present invention can also be seen by an examination of the results of simulations of several pre-emphasis filter based systems. The simulated data rate is 8.33 Mbps. The bit error rate (BER) against signal-to-noise ration (SNR) for a 3 tap fractional spaced (T/2) pre-emphasis filter system (assuming no synchronization error) is given in FIG. 9. For comparison BER v SNR for a non-compensated system is also shown and it will in fact be seen that the pre-emphasis filter system provides only a small improvement. However, this is because a category 5 twisted pair has a relatively linear phase and thus the major distortion is on the pulse shape and there is no severe intersymbol interference if the receiver synchronization is perfect. However, once there is a synchronization error, the distorted signal will enhance the intersymbol interference so that the BER drops significantly. FIG. 10 shows the BER v SNR assuming a synchronization error of 25% of a symbol period for a non-compensated system, a 3 tap fractional spaced (T/2) pre-emphasis filter system, and a lower bound (ie infinite number of taps for a fractional spaced (T/2) pre-emphasis filter). While the best results are obtained with the lower bound simulation, it can be seen that the 3-tap filter provides good results.

Thus the present invention provides a data transmission system in which data can be transmitted in a building along twisted pairs using a pre-emphasis filter system to compensate for channel distortion. Of course good results can also be obtained if a pre-emphasis filter compensation and equalization are both employed together. The pre-emphasis filter system of the present invention can of course also be generally applied to other types of twisted pairs and/or cables with different gauges and lengths. For different environments a different number of taps may be required in the pre-emphasis filter, but this can easily be accomplished by implementing the filter with a programmable digital signal processor and the required number of taps can be determined during channel characterization.

A data transmission system of the present invention can be used by telecom companies to provide services such as video-on-demand, internet connection and other interactive multimedia services. The system can also be used by hotels, hospitals, corporations and the like to deploy their private intranets, VOD and multimedia information systems.

What is claimed is:

1. A data transmission system comprising:
    a server;
    a plurality of subscribers;
    a plurality of data lines from said server;
    connection means for connecting to said subscribers to said server, said subscribers being connected to said connection means by respective cables;
    pre-emphasis filter means provided in each said data line between said server and said connection means;
    means for transmitting a test signal along a channel from said server to a receiver at a said subscriber;
    means for returning said test signal from said receiver to said transmitting means; and
    means for calculating distortion properties of said channel from a delay in returning said test signal from said receiver to said transmitting means and for establishing required properties of said pre-emphasis filter means to compensate for said distortion properties.

2. A system as claimed in claim 1 wherein said cables are twisted-pair cables.

3. A system as claimed in claim 1, wherein said transmitting means is adapted to generate an increasing test signal preceded by a header, and said receiving means is adapted to generate a first return signal when said header is received and a second return signal when said test signal reaches a predetermined threshold at said receiving means, and said transmitting means includes clock means for determining the time interval between said test signal being transmitted by said transmitting means and said return signals being received at said transmitting means from said receiving means.

4. A system as claimed in claim 3 wherein said test signal is a quantized or non-quantized linearly increasing test signal.

5. A system as claimed in claim 1 wherein said pre-emphasis filter means comprises a tap-line filter.

6. A system as claimed in claim 5 wherein said pre-emphasis filter comprises a conventional tap-line filter.

7. A system as claimed in claim 5 wherein said pre-emphasis filter comprises a fractional tap-line filter.

8. Apparatus for the characterization of the amplitude and phase response of a data channel between a transmitter and a receiver, wherein said transmitter comprises means for transmitting a test signal to said receiver, means for detecting the arrival of a return signal from said receiver and means for timing the delay between transmitting said test signal and detecting said return signal, wherein said receiver comprises means for generating a return signal when a received transmitted signal exceeds a predetermined threshold, and means for calculating the amplitude and phase response of said data line from said delay.

9. Apparatus as claimed in claim 8 wherein said transmitting means is adapted to generate an increasing test signal preceded by a header, and said receiving means is adapted to generate a first return signal when said header is received and a second return signal when said test signal reaches a predetermined threshold at said receiving means, and said transmitting means includes clock means for determining the time interval between said test signal being transmitted by said transmitting means and said return signals being received at said transmitting means from said receiving means.

10. Apparatus as claimed in claim 9 wherein said test signal is a quantized or non-quantized linearly increasing signal.

11. A method for transmitting data from a server to a plurality of subscribers along a data channel comprising a cable having relatively linear amplitude and phase distortion properties, comprising:
characterizing the distortion properties of said data channel prior to transmitting said data along said data channel, said distortion properties being characterized by:
transmitting a test signal along said data channel from said transmitter to a receiver;
generating a return signal from said receiver upon receipt of said test signal; and
calculating the distortion properties of said channel from the delay in returning said test signal from said receiver to said transmitter; and
passing said data through a pre-emphasis filter prior to transmission along said data channel to compensate for said amplitude and phase distortion.

12. A method as in claim 11, wherein said cable is a twisted-pair cable.

13. A method for transmitting data from a server to a plurality of subscribers along a data channel comprising a cable having relatively linear amplitude and phase distortion properties, comprising characterizing the distortion properties of said data channel prior to transmitting said data along said data channel, and passing said data through a pre-emphasis filter prior to transmission along said data channel to compensate for said amplitude and phase distortion, wherein said test signal comprises a header followed by an increasing signal and generating a first return signal upon receipt at said receiver of said header and a second return signal when said test signal reaches a predetermined threshold at said receiver, counting the time delay between said return signals being received at said transmitter, and calculating said distortion properties from said delay.

14. A method as in claim 13, wherein said cable is a twisted-pair cable.

15. A method as claimed in claim 13 wherein said test signal is a quantized or non-quantized linearly increasing signal.

16. A method for the characterization of the amplitude and phase response of a data channel between a transmitter and a receiver, comprising transmitting a test signal to said receiver, generating a return signal from said receiver to said transmitter when a received transmitted signal exceeds a predetermined threshold, detecting the arrival at said transmitter of a said return signal from said receiver and timing the delay between transmitting said test signal and detecting said return signal, and calculating the amplitude and phase response from said delay.

17. A method as claimed in claim 16 wherein said test signal comprises an increasing signal preceded by a header, and wherein a first return signal is generated upon receipt at said receiver of said header, and a second return signal is generated when said test signal reaches a predetermined threshold at said receiver, and wherein the time interval between receipt at said transmitter of said first and second return signals is counted.

18. A method as claimed in claim 17 wherein said test signal is a quantized or non-quantized linearly increasing signal.

* * * * *